United States Patent [19]

Wolstenholme

[11] Patent Number: 5,319,593
[45] Date of Patent: Jun. 7, 1994

[54] MEMORY ARRAY WITH FIELD OXIDE ISLANDS ELIMINATED AND METHOD

[75] Inventor: Graham R. Wolstenholme, Redwood City, Calif.

[73] Assignee: National Semiconductor Corp., Santa Clara, Calif.

[21] Appl. No.: 994,120

[22] Filed: Dec. 21, 1992

[51] Int. Cl.⁵ .............................. G11C 13/00
[52] U.S. Cl. .................. 365/185; 365/184; 365/189.01
[58] Field of Search ............ 365/185, 189.01, 184, 365/104

[56] References Cited

U.S. PATENT DOCUMENTS

| | | | |
|---|---|---|---|
| 5,050,125 | 9/1991 | Momodomi et al. | 365/185 |
| 5,109,361 | 4/1992 | Yim et al. | 365/185 |
| 5,204,835 | 4/1993 | Eitan | 365/185 |

Primary Examiner—Eugene R. LaRoche
Assistant Examiner—Son Dinh
Attorney, Agent, or Firm—Limbach & Limbach

[57] ABSTRACT

An electrically programmable nonvolatile semiconductor memory which includes an array of programmable transistor cells, such as EPROM cells, which avoids the use of field oxide islands to provide electrical isolation. The cells are arranged in X number of rows and Y number of columns with the cells in at least two of the rows being designated as select cells and the remaining cells being designated as memory cells. Control circuitry is provided for causing the select cells to supplying programming voltages to selected ones of the memory cells. Alternate ones of the select cells are initially programmed to a high threshold (inactive) state so as to provide electrical isolation for adjacent select cells which remain in the low threshold (active) state.

13 Claims, 10 Drawing Sheets 5,319,593

MEMORY ARRAY WITH FIELD OXIDE ISLANDS ELIMINATED AND METHOD

BACKGROUND OF THE INVENTION

1. Field of the Invention

The present invention relates generally to semiconductor memories and in particular to electrically programmable memory (EPROM and flash) arrays which avoid the use of field oxide islands to provide electrical isolation.

2. Background Art

An electrically programmable read only memory (EPROM) is a type of memory which is non-volatile meaning that data stored in the memory is not lost when power is removed. EPROM devices are erased by exposure to ultraviolet light. A type of memory commonly referred to as a flash memory adds complete electrical erasure and reprogramming functionality to the non-volatility of the EPROM.

FIG. 1 is a diagram of a conventional EPROM memory array 10 of 16 memory cells. FIGS. 2A and 2B are taken through section lines 2A—2A and 2B—2B of FIG. 1. Exemplary memory cells 12A includes a drain region 14 and source region 22. Adjacent exemplary memory cell 12B includes a drain region 14 shared in common with transistor 12A.

A word line 16 made of doped polysilicon (poly 2) functions as a control gate for the transistors. Floating gates 24 are made of doped polysilicon (poly 1) and are disposed between the transistor memory cell channels and the word lines 16 (FIG. 2B). A thin oxide 20 extends over the surface of the transistors and between the floating gates 24 and the transistor channel region.

Contact openings 15 are formed so that the metal bit line 18 can contact the drains of the memory cells. As can be seen in FIG. 1, buried N+ bit lines 18 function to connect the source regions together. As shown in FIG. 2B, the source regions 22 are comprised of an N+ region.

FIG. 3 illustrates the manner in which the memory cells 12 are programmed. First, a relatively high voltage Vpp (typically 13 volts) is applied to the poly 2 word line 16 (the control gate). An intermediate voltage Vd (typically 6 volts) is applied to the drain region 14 and a low voltage Vss (typically 0 volts) is applied to the source region 22. "Hot" electrons are generated at the edge of the drain. The high voltage Vpp on the control gate electrode (poly 2 word line) 16 causes some of the free electrons to cross the gate oxide 20 and enter the floating gate (poly 1) 24 where the electrons remain trapped.

Erasure is accomplished by discharging the floating gate 24. In the case of an EPROM cell, the discharge is accomplished by exposure to U.V. light. In the case of a flash memory cell, the erasure mechanism is Fowler-Nordheim tunneling, as is well known.

A memory cell is read by applying voltage Vd (typically +3 volts) to the drain and grounding the source (Vss). A positive voltage (Vcc) is applied to the control gate (word line) 16. If the cell had been previously programmed, the electrons will have increased the threshold voltage of the cell and the gate/source voltage will not be sufficient to render the cell conductive. Thus, no current will flow. Conversely, if the cell has not been programmed, the gate/source voltage will be sufficient to render the cell conductive and current will flow. Current flow or lack thereof is detected by a sense amplifier (not depicted).

FIG. 4 is a schematic diagram of a segment of an exemplary conventional memory array which includes a total of twelve memory cells Q1-Q12, with cells Q1-Q4, Q5-Q8 and Q9-Q12 being in separate rows and having common word lines WL-1, WL-2 and WL-3, respectively. The three depicted bit lines are BL-1, BL-2 and BL-3. The appropriate bit lines are connected to four exemplary select transistors 28A-28D, there being at least one select transistor associated with each column of memory cells. Bit lines BL-1 and BL-3 comprising N+ lines which are strapped with metal bit lines (not depicted) which can be accessed by way of contacts 30A and 30B and bit line BL-2 is a buried line which can be accessed indirectly through select transistors 28B and 28C.

Select transistors 28A and 28B are in a common row and have their control gates connected to select line Select 1. Similarly, select transistors 28C and 28D are in a common row and have their control gates connected to select line Select 2. Preferably, a second set of select transistors 28A', 28B', 28C' and 28D' are provided which are connected to the opposite end of the memory cell segment in the same manner as select transistors 28A, 28B, 28C, and 28D. A second pair of select lines Select 1' and Select 2', driven in parallel with lines Select 1 and Select 2, respectively, are provided for controlling the second set of select transistors. The second set of select transistors are connected to contacts 30A' and 30B' which are driven in parallel with contacts 30A and 30B, respectively.

Referring to FIG. 5, a plan view of an the layout of an integrated circuit implementing the memory array segment of FIG. 4 may be seen. The second set of select transistors 28A', 28B', 28C' and 28D' are not depicted. Each cell of the array is located in the region near the intersection of a bit line BL and a word line WL. Select transistor 28A is disposed in the region near the intersection of bit line BL-1 and select line Select 1. Similarly, select transistors 28B, 28C and 28D are located near the regions of the intersection of line Select 1/bit line Bl-3, line Select 2/bit line Bl-1, and line Select 2/bit line BL-4, respectively.

Electrical isolation is provided by the use of field oxide (FOX) regions. When the FOX regions are disposed in the array of select transistors or memory cells they are commonly referred to as FOX islands. By way of example, FOX island 32A extends down into the regions between transistors 28A and 28B. There is also a FOX island 32C between transistor 28C and an select transistor not depicted. As a further example, a FOX island 32D is disposed between transistors 28C and 28D.

The select transistors 28A-28D are typically conventional MOS transistors rather than the floating gate transistor such as devices Q1-Q12 used as memory cells. However, it is become conventional to simplify circuit layout by using the same floating gate transistor devices used as memory cells as the select transistors. The floating gate select transistors are all unprogrammed so that no charge exists on the floating gate. Accordingly, the threshold voltage of the floating gate transistor is sufficiently low to permit the cell to perform the select function accomplished by conventional select transistors.

The use of the same type of floating gate transistor in both the memory cell array and the cell select section has provided an improved memory layout scheme.

However, shortcomings remain in such conventional approaches.

The FOX islands 32 located in the FIG. 5 memory are disadvantageous for several reasons. First, the intersection of the FOX islands 32 and bit/select lines represents the largest step in the array. FIG. 6 shows a cross-section taken through section line 6—6 of FIG. 5 along the select line Select 2. The maximum height of the structure is the combination of select line Select 2 and the poly 1 line 24 above the FOXs islands seen 32.

Referring to FIG. 7, which is a cross-section taken from FIG. 5 and which is at right angle to the FIG. 6 cross-section, the distance from the center of the FOX island 32D to the top surface of the island is typically about 2000 Å. The thickness of the poly 1 floating gate 24 is typically 1500 Å and the thickness of the dielectric ONO (oxide-nitride-oxide) sandwich layer 40 is 500 Å. Added to this is the poly 2 layer and the tungsten silicide layer which total 4500 Å and which form the Select 2 line. This gives a grand total of approximately 8500 Å. It is difficult to reliably planarize a deposited oxide layer, such as BPSG (borophosphosilicated glass) over a step of this magnitude.

In addition, the presence of a FOX island 32 disposed in the memory array results in a tendency to produce Poly 1 stringers at Poly 1 and SAE etch (self aligned etch). Further, the FOX islands increase the size of the array and also increase the resistance of the bit lines.

The present invention eliminates the necessity of providing electrical isolation between select transistors using FOX islands. Accordingly, the disadvantages arising from the use of FOX islands noted above are eliminated. These and other advantages of the present invention will become apparent to those skilled in the art upon a reading of the following detailed description of the invention together with the drawings.

SUMMARY OF THE INVENTION

The present invention is directed to an electrically programmable semiconductor memory which includes an array of programmable transistor cells. One example, is a floating gate transistor which includes a floating gate electrode and a control electrode such as used in EPROM and flash memories. Such cells can be either programmed to a high threshold state (with a charge being placed on the floating gate) or a low threhold voltage state (with no charge on the floating gate). In the low threshold state the cell can be rendered conductive with a relatively low applied control gate voltage whereas such low control gate voltage would be insufficient to render the cell conductive when the cell has been programmed to the high threshold state.

The cells are arranged in Y number of columns and X number of rows with at least one of the rows of cells being designated as memory cells and at least two of the rows being designated as select cells. Typically, the memory would include considerably more rows of memory cells than rows of select cells.

The memory further includes control means for causing the select cells to supply programming voltages to selected ones of the memory cells. Such programming voltages may include, for example, a positive voltage to be applied to the drain electrode of the memory cell and a ground connection to be applied to the source electrode of the cell.

The two rows of select cells eliminate the requirement that field oxide (FOX) islands be used for the purpose of providing electrical isolation between the select cells. For example, the select cells can be alternately programmed to a high and low threshold states. The select cells programmed to a low threshold state can then be used to apply the programming voltages to the memory cells. Further, the select cells programmed to the high voltage state and disposed intermediate the cells programmed to the low voltage state, function to provide electrical isolation which has been typically provided by FOX islands. The avoidance of such FOX islands eliminates various problems associated with their use.

The subject invention is also directed to a method of programming a nonvolatile semiconductor memory which includes an array of programmable transistor cells arranged in Y number of columns and X number of rows. Such cells may include, for example, EPROM cells or flash memory cells having floating and control gate electrodes.

The method includes the step of programming the cells in at least two rows of the array to alternating low and high threshold states, with the states alternating both along the rows and columns. The cells programmed to the high threshold state can then function to provide electrical isolation for the cells programmed to the low threshold state.

The claimed method further includes the step of programming selected ones of the remaining cells of the array by applying programming voltages through the alternating low threshold state cells. This approach again avoids the use of FOX islands for providing electrical isolation and the attendant disadvantages which arise therefrom.

DETAILED DESCRIPTION OF THE INVENTION

Figure 1:
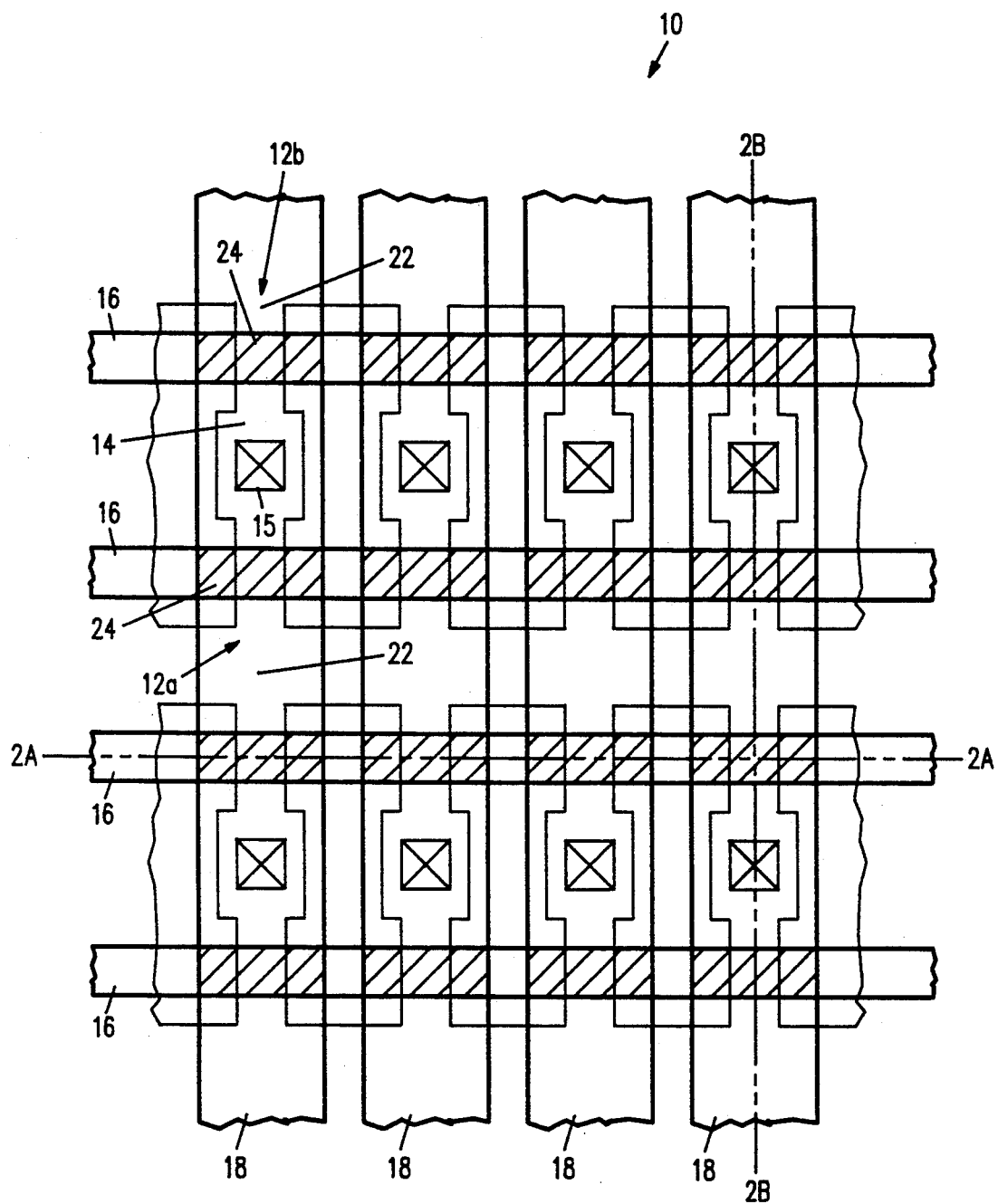
FIG. 1 is a plan view of a segment of the memory cell array of a conventional EPROM memory showing, among other things, the orthogonal bit lines and word lines.
Figure 2A:
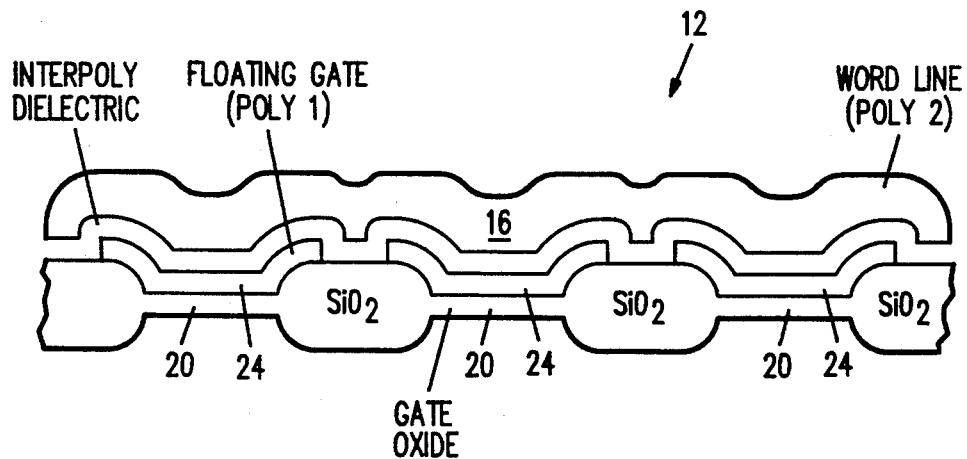
FIG. 2A is a sectional view of the memory cell array of FIG. 1 taken through section lines 2A—2A.
Figure 2B:
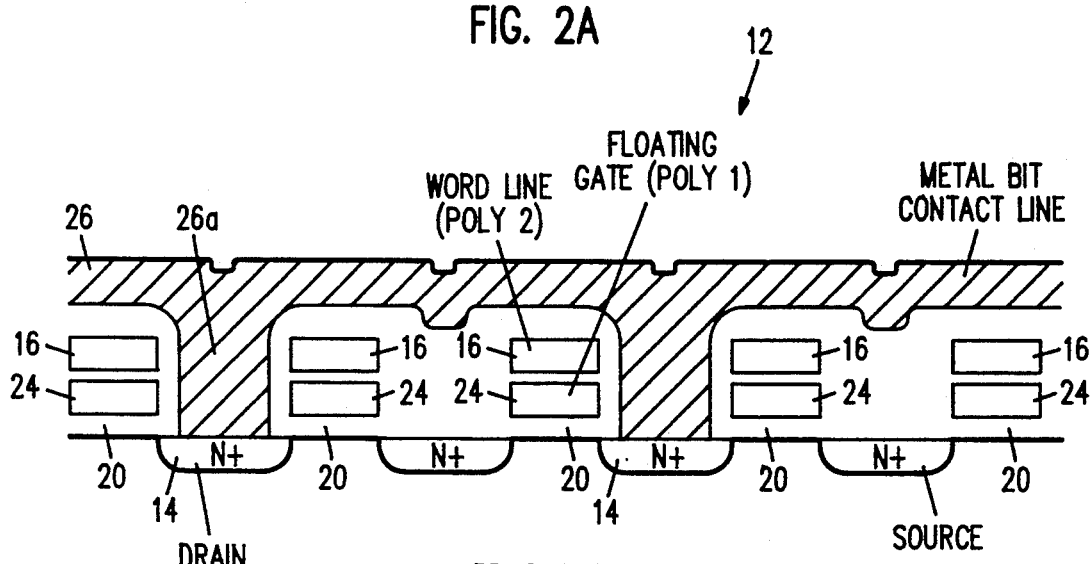
FIG. 2B is a sectional view of the memory cell array of FIG. 1 taken through section lines 2B—2B thereof.
Figure 3:
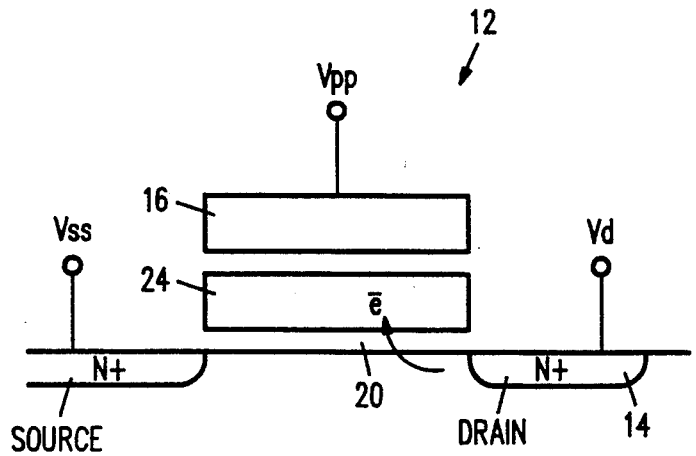
FIG. 3 is a diagram of an conventional EPROM cell depicting the manner in which the cell is programmed.
Figure 4:
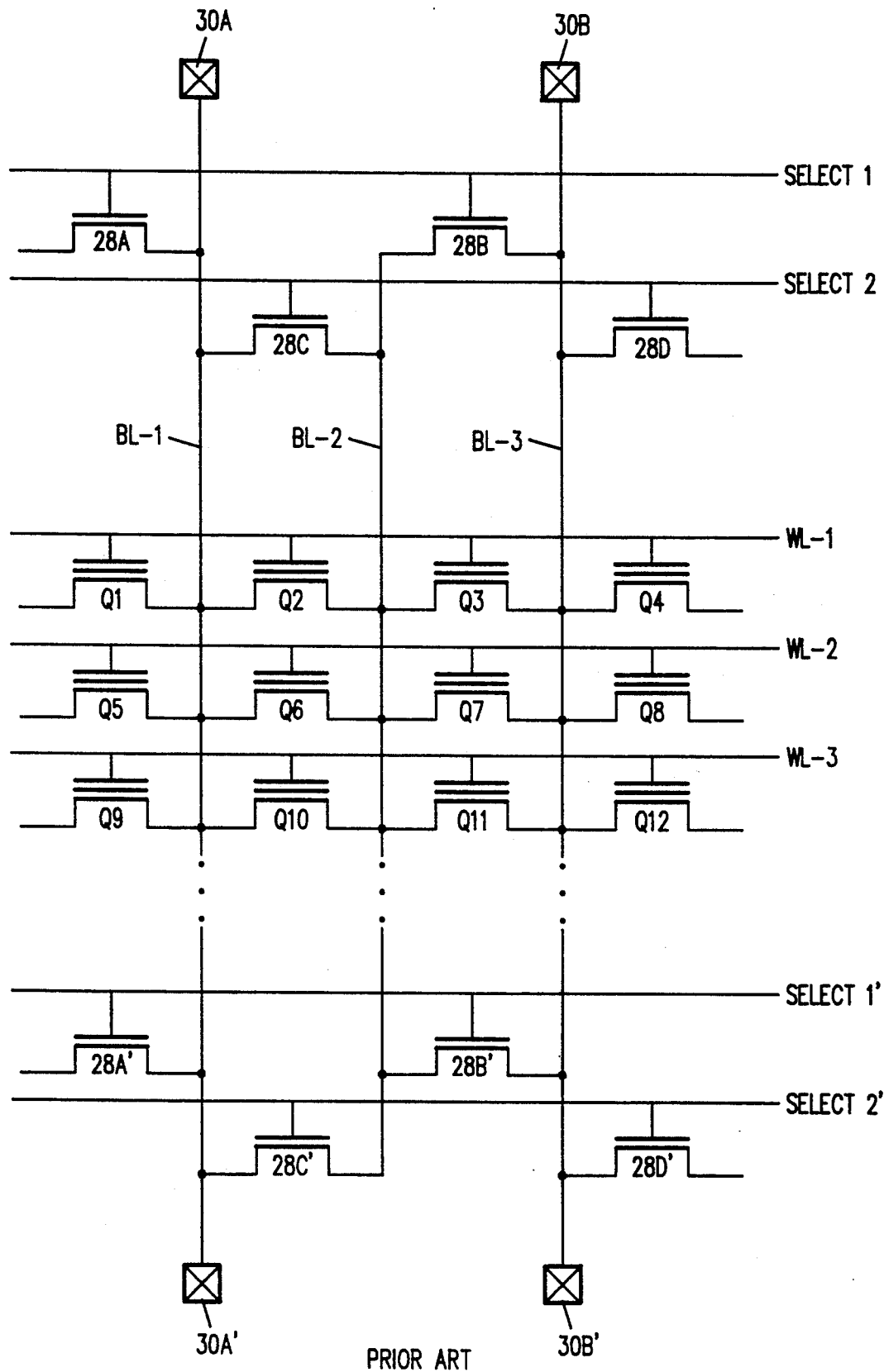
FIG. 4 is a schematic diagram of a segment of a conventional memory, including twelve memory cells and eight memory cell select transistors.
Figure 5:
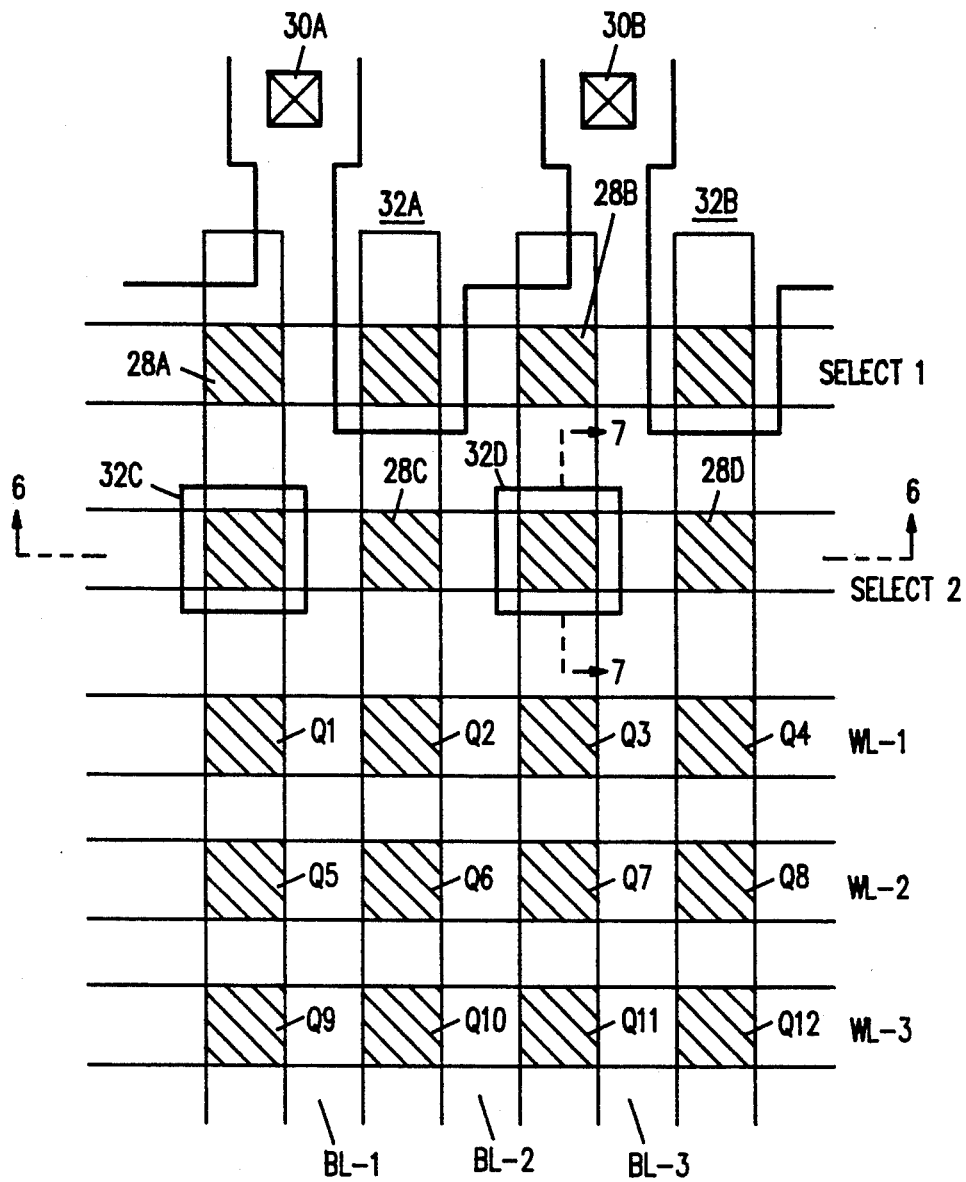
FIG. 5 is a plan view of the segment of a conventional memory in accordance with the schematic diagram of FIG. 4.
Figure 8:
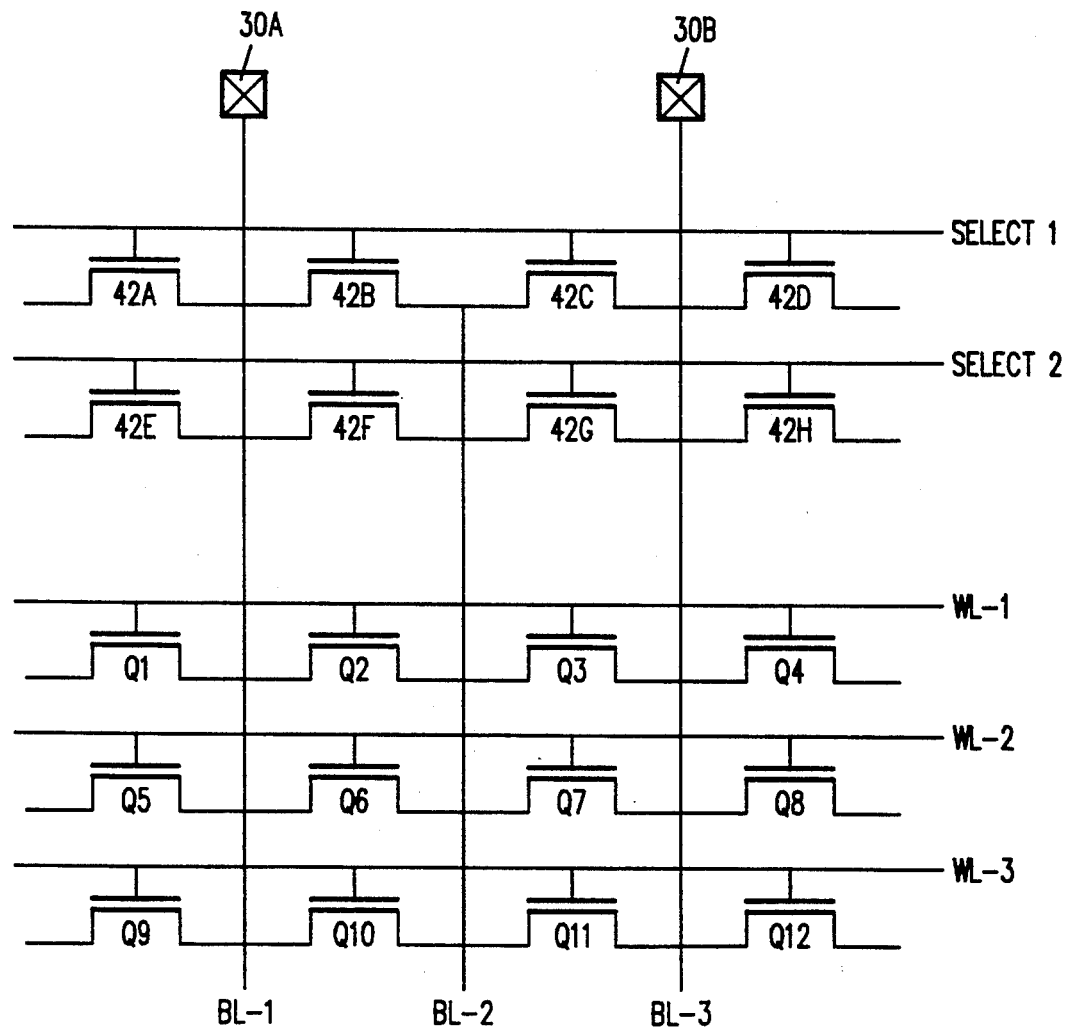
FIG. 8 is a schematic diagram of a memory segment in accordance with the present invention.

Referring again to the drawings, FIG. 8 is a schematic diagram of a segment of a memory which incorporates the subject invention. The memory cells, sometimes referred to herein as programmable transistor cells, Q1–Q12 are conventional EPROM cells similar to the floating gate transistor devices that are used in the prior art memory of FIG. 4 and as shown in FIG. 3. The select transistors 42A–42H are also preferably floating gate transistor devices such as shown in FIG. 3. Note that, although not depicted, there is preferably another set of select transistors disposed at the opposite end of the memory cells which are driven in parallel with the depicted select transistors As previously described, the use of floating gate transistor devices in the memory cell select portion of a memory was known. However, the previous designs still require the use of FOX islands to provide isolation. The present invention provides isolation between adjacent select transistors using a floating gate cell or similar programmable cell which has been programmed to a high threshold state (the floating gate is charged). Thus, unlike the unprogrammed select transistors, the isolation transistors will not be rendered conductive when programming voltages are applied for the purpose of programming the cell of the memory array.

The cell select circuitry of FIG. 8 thus includes a transistor select device in each column of the memory cells. Every other cell select transistor device is programmed to a high threshold (inactive) state so the low threshold (active) state cell select devices can perform the function of accessing the appropriate memory cells. The inactive select devices further function to provide the necessary electrical isolation between adjacent active devices.

Figure 6:
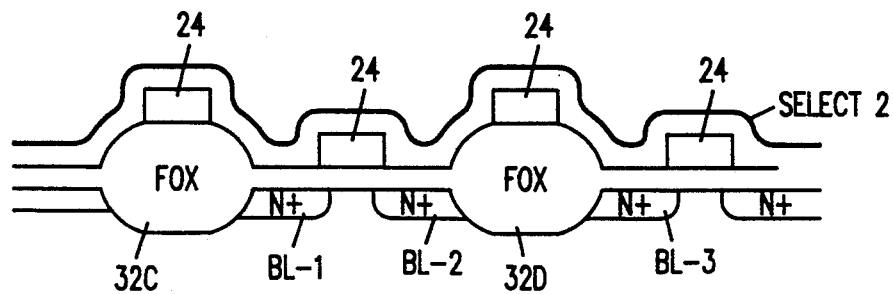
FIG. 6 is a sectional view of the conventional memory of FIG. 5 taken through section line 6—6 thereof.
Figure 7:
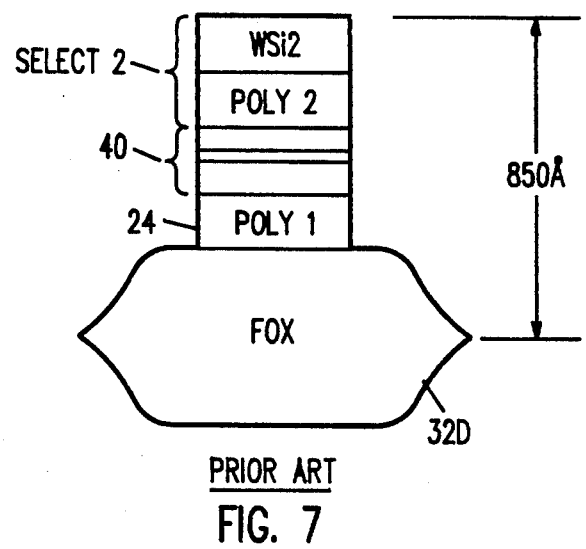
FIG. 7 is an enlarged sectional view of the conventional memory of FIG. 5 taken through section line 7—7 thereof.
Figure 9:
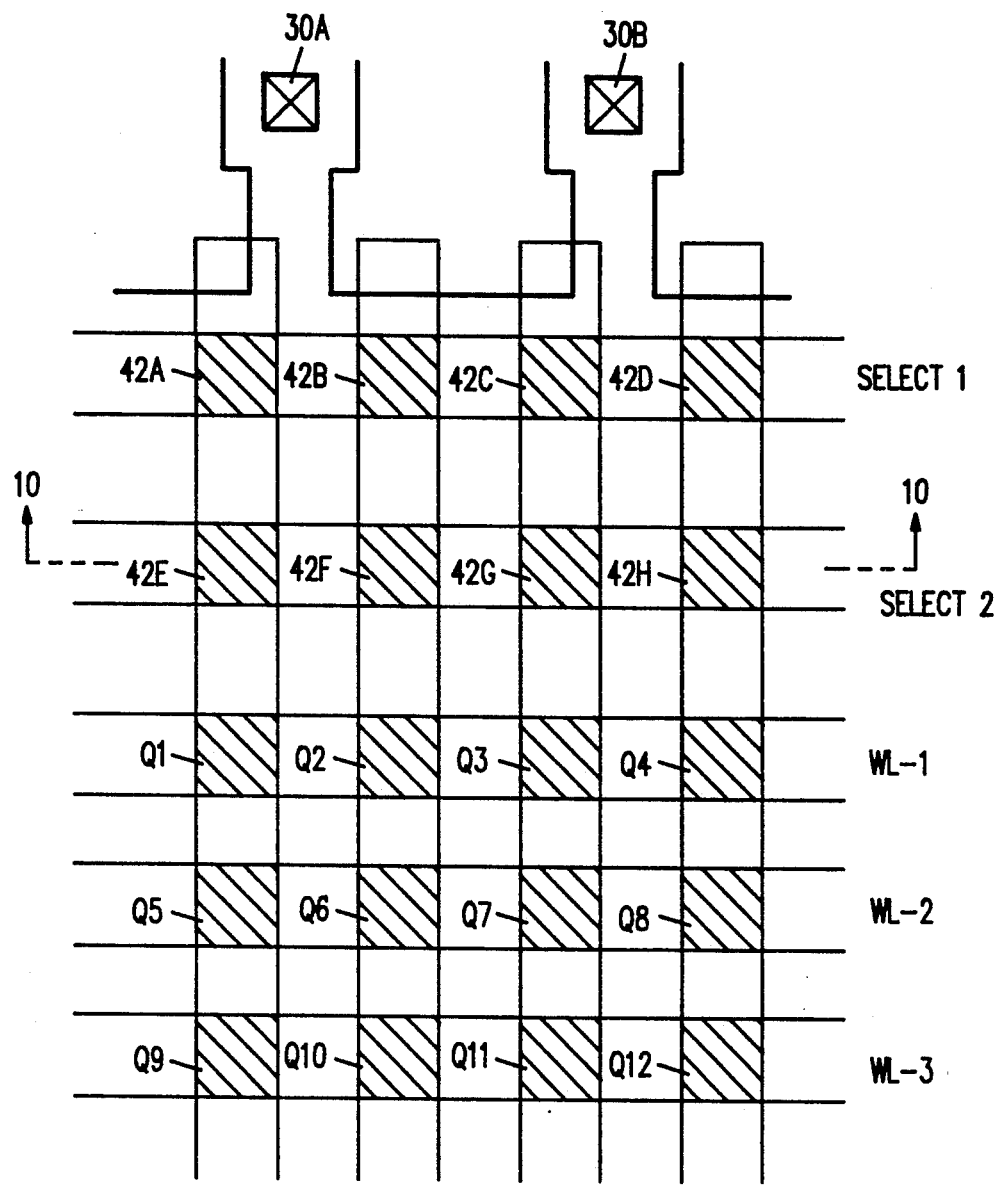
FIG. 9 is a plan view of the segment of the memory of FIG. 8 and in accordance with the present invention.
Figure 10:
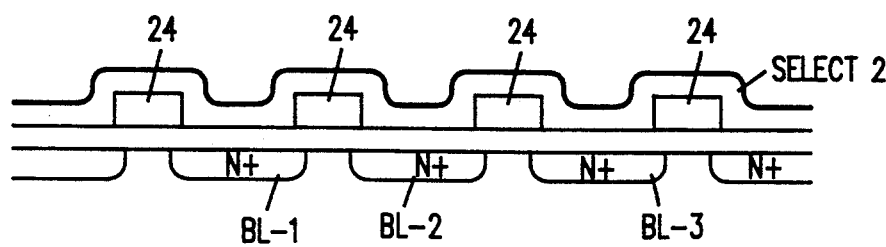
FIG. 10 is a sectional view of the memory segment of FIG. 9 taken through section lines 10—10 thereof.

FIG. 9 shows the symmetry of the layout of a memory constructed in accordance with the present invention. FOX islands are not used for isolation therefor the attendant problems previously noted do not occur. As can be seen in the cross-section of FIG. 10, taken through section line 10—10 of FIG. 9, the maximum step height is dramatically reduced in comparison to the prior art structure shown in FIGS. 6 and 7.

The select transistors 42 must initially be programmed to the proper state. Alternate ones of the select transistors, along both the rows and columns, are programmed to a high threshold state (inactive). The select transistors disposed intermediate the high threshold transistors remain in the low threshold state (active) and are used to access the memory cell transistors.

Figure 11A:
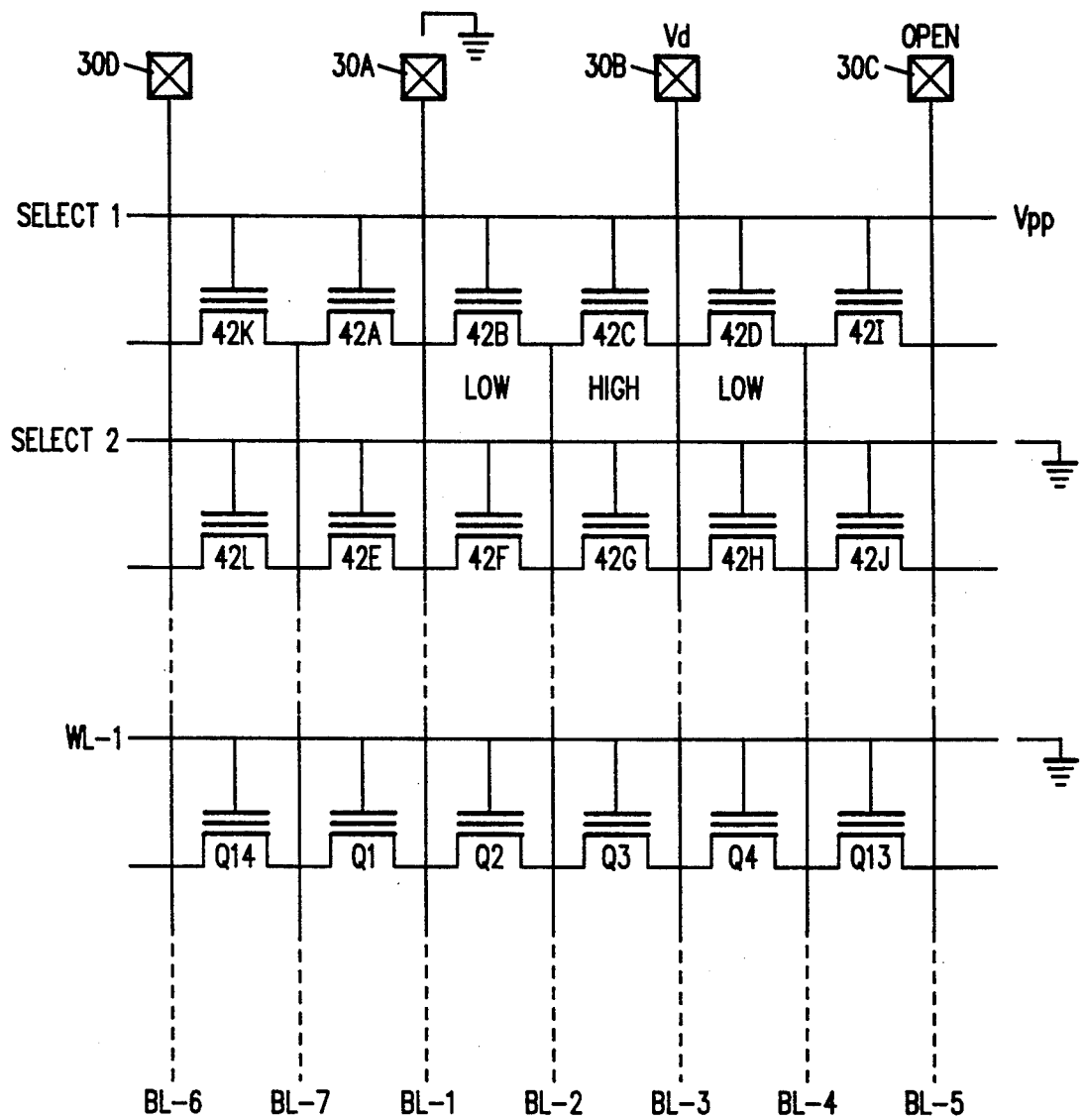
FIG. 11A shows the manner in which the select transistors of the FIG. 8 array of the present invention may be programmed.

FIG. 11A depicts the manner in which the appropriate select transistors are programmed to a high threshold state. The FIG. 11A structure is similar to that of FIG. 8 except additional structure is shown. In the programming example of FIG. 11A, select transistor 42C is being programmed to a high threshold state.

First, the word lines WL associated with the memory cells are all forced to ground potential. In addition, the Select 2 line associated with the row of select transistors not being programmed is forced to ground potential. Line Select 1, associated with select transistor 42C is raised to the high potential Vpp. Contact 30C associated with bit line BL-5 is left open (floating) and contact 30A associated with bit line BL-1 is forced to ground potential.

Transistor 42B is already in a low threshold state and will be rendered conductive by the potential Vpp applied to the gate electrode. Conductive transistor 42B will function to bring the source electrode (connected to bit line BL-2) of transistor 42C close to ground, with voltage Vd (typically +6 volts) being applied directly to the drain electrode (connected to bit line BL-3). Thus, as can be seen in FIG. 3A, the appropriate voltages are applied to transistor 42C to program the transistor to a high threshold state.

Figure 11B:
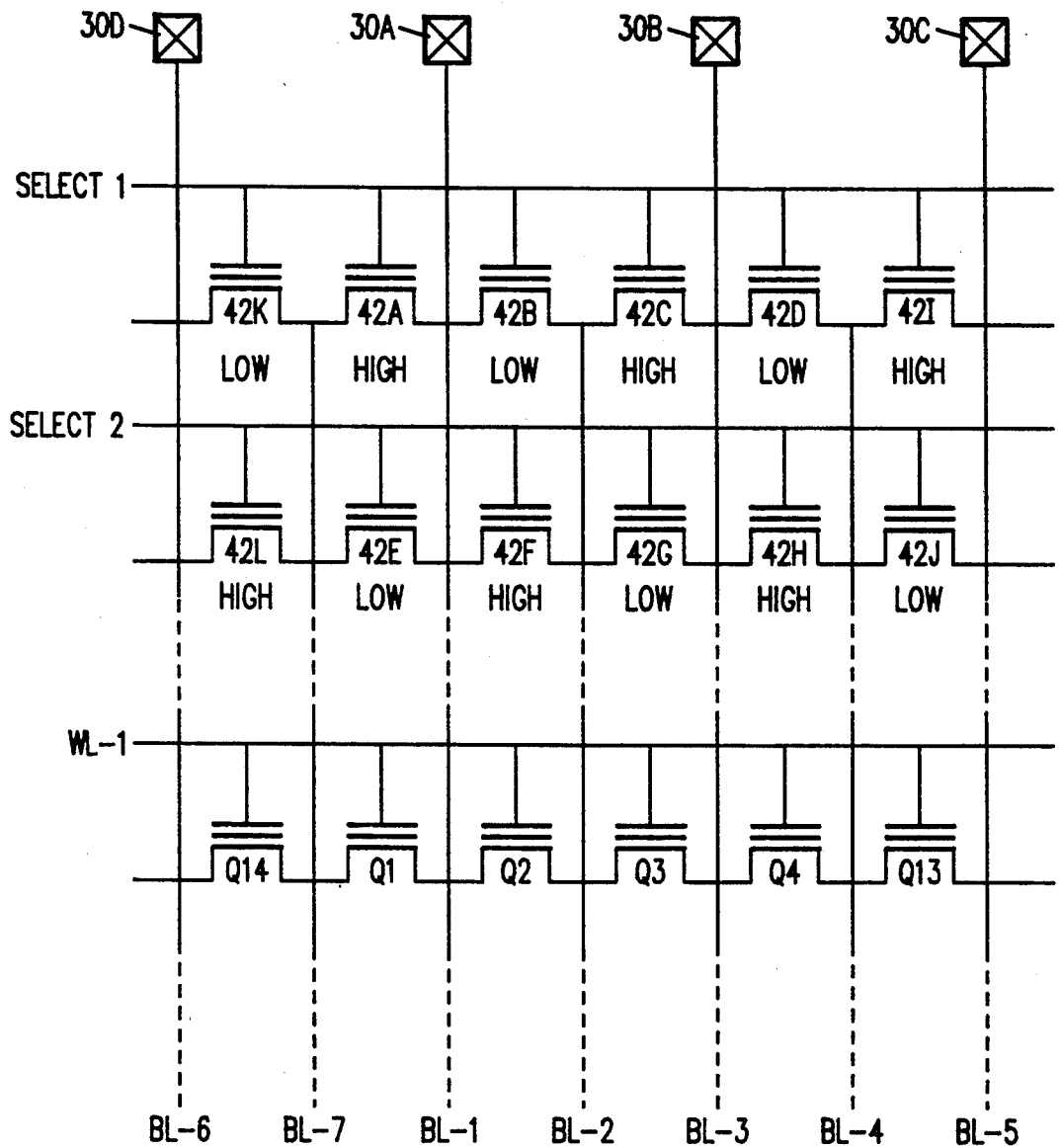
FIG. 11B shows the select transistor section of the FIG. 8 array after the select transistors were programmed.

The remaining alternating select transistors are also programmed to a high threshold state as shown in FIG. 11B. As can be seen in the figure, the threshold levels of the select transistors 42 alternate between along the rows (X axis) and along the columns (Y axis).

Figure 11C:
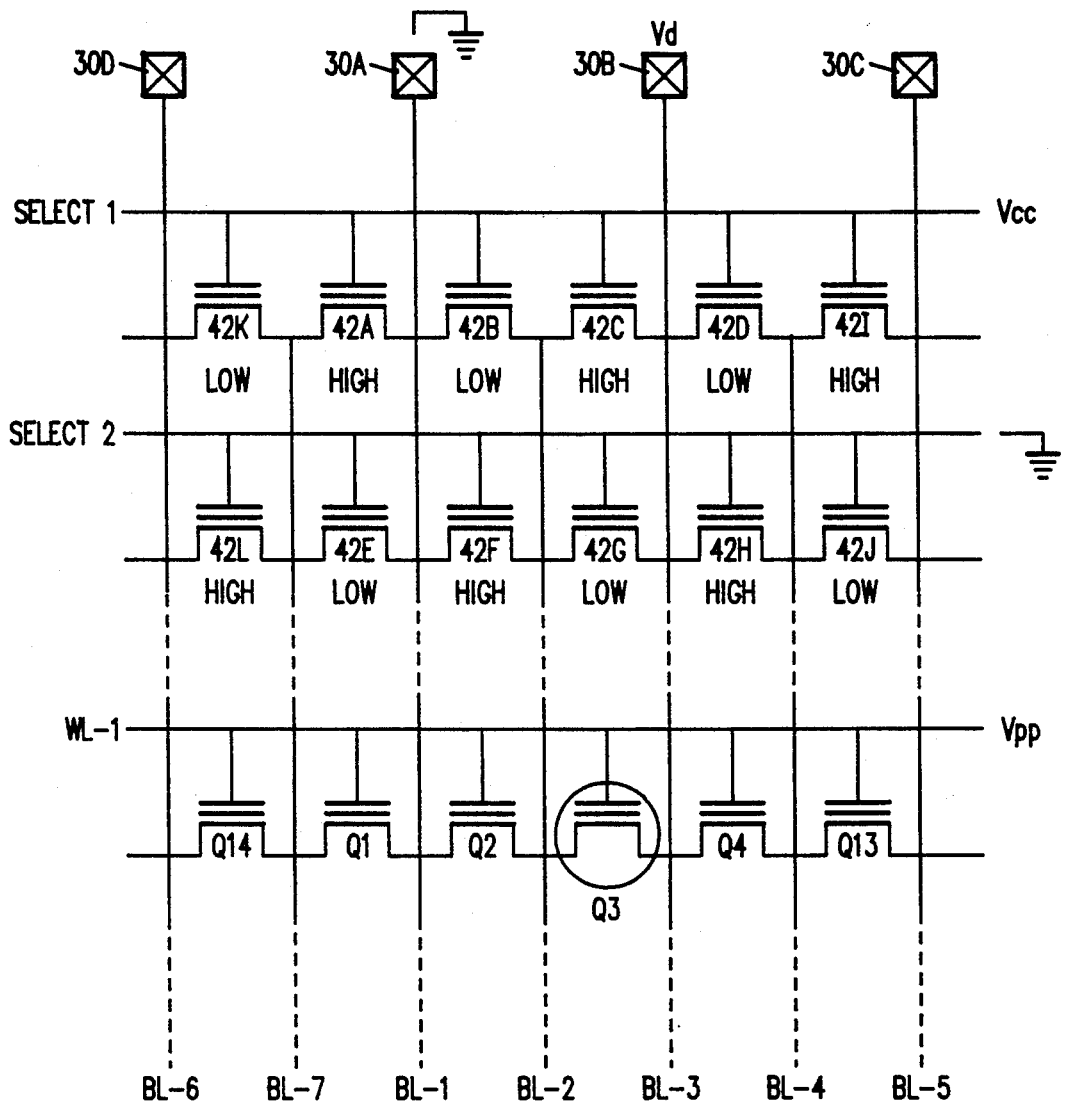
FIG. 11C shows the manner in which a cell of the FIG. 8 array is programmed.

Once the select transistors have been programmed, the memory cells may be programmed. FIG. 11C shows the manner in which an exemplary memory cell Q3 is programmed in the memory array. Ground potential is applied to contact 30A and voltage Vcc is applied to the Select 1 line. Voltage Vcc is applied to contact 30B. This combination of voltages causes low threshold select transistor 42B to become conductive. The voltage is not sufficient, however, to render high threshold transistor 42C conductive. High voltage Vpp is applied to word line WL-1 for the row in which the cell Q3 is located. Voltage Vd is connected to the drain electrode of cell Q3 and the source electrode of Q3 is coupled to ground potential by way of select transistor 42B. Thus, the voltages applied to cell Q3 are appropriate for programming the cell. Meanwhile, the high threshold select transistors function to provide electrical isolation for adjacent low threshold devices.

Figure 12:
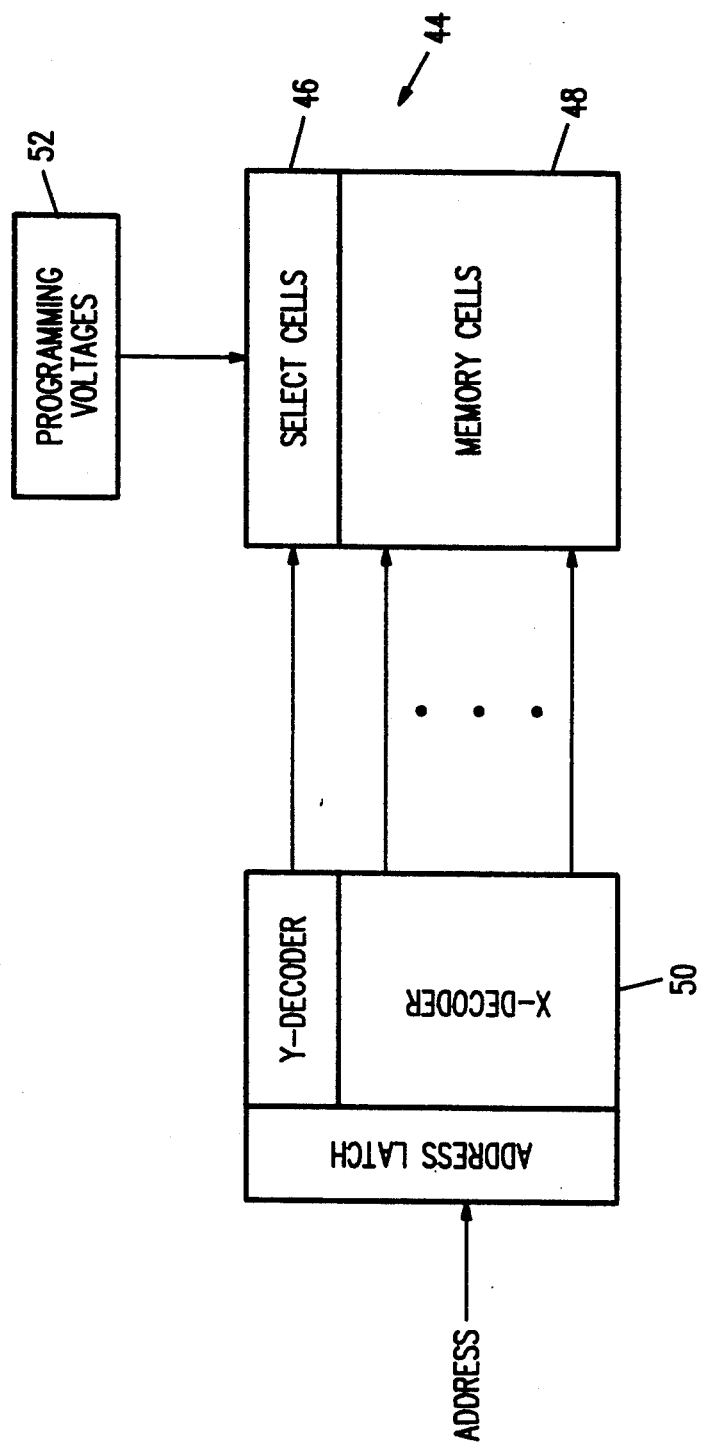
FIG. 12 is a simplified block diagram of the subject invention.

FIG. 12 is a simplified overall block diagram of the subject invention. The array, generally designated by the numeral 44, includes Y number of rows and X number of columns of transistor cells. At least two of the rows are designated as select cell to form a select cell array 46 and the remaining cells are designated as memory cells to form a memory cell array 48.

Element 50 represents a conventional address decoder and element 52 represents the conventional control circuitry for causing the select cells to supply the various voltages used for programming the memory cell array 48.

Thus, a novel nonvolatile semiconductor memory array and method have been disclosed which avoid the need for field oxide (FOX) islands for the purpose of providing electrical isolation. Although a preferred embodiment has been described in some detail, it is to be understood that certain changes can be made by those skilled in the art without departing from the spirit and scope of the invention as defined by the appended claims. For example, the invention can be utilized in programmable memory types other than EPROMs such as flash memories.

I claim:

1. An electrically programmable nonvolatile semiconductor memory comprising:
    an array of programmable transistor cells arranged in Y number of columns and X number of rows, said array including at least one row of said cells designated as memory cells and at least two rows of said cells designated as select cells; and control means for causing said select cells to supply programming voltages to selected ones of the memory cells;

and wherein the programmable transistors are programmable to either a low threshold state or a high threshold state;

and wherein said select cells in the at least two rows and in the columns are programmed to alternate between high and low threshold states.

2. The memory of claim 1 wherein said memory is electrically erasable and wherein said control means also functions to cause said select cells to supply memory erase voltages to the memory cells.

3. The memory of claim 1 wherein the transistor cells each include a floating gate electrode and a control gate electrode.

4. The memory of claim 1 wherein the control means causes the select cells programmed to the low threshold state to supply the programming voltages and wherein the select cells programmed to the high state function to provide electrical isolation between adjacent select cell programmed to the low state.

5. The memory of claim 1 wherein the two rows of select cell are disposed adjacent one another.

6. The memory of claim 1 wherein the transistor cells each include a floating gate electrode and a control gate electrode and wherein the select cells in one of said rows have the control gate electrodes connected in common.

7. An electrically programmable nonvolatile semiconductor memory comprising:

an array of transistor cells programmable to either a high or a low threshold voltage state, said cells being arranged in Y number of columns and X number of rows including at least one row of cells designated as memory cells and at least two rows of said cells designated as select cells;

wherein said select cells in the rows and columns are programmed to alternating high and low threshold state; and control means for causing said select cells programmed to the low threshold state to supply programming voltages to selected ones of the memory cells, with the select cells programmed to the high threshold state functioning to provide electrical isolation between adjacent select cells programmed to the low threshold state.

8. The memory of claim 7 wherein the transistor cells each have a floating gate and a control gate and wherein the control gates of the select cells disposed in one of the rows are connected in common.

9. A method of programming a nonvolatile semiconductor memory which includes an array of programmable transistor cells arranged in Y number of columns and X number of rows comprising the following steps:

programming the cells in at least two rows of the array to alternating low and high threshold states, with the states alternating both along the rows and along the columns; and programming selected ones of the remaining cells of the array by applying programming voltages through said alternating low threshold state cells.

10. The method of claim 9 wherein the at least two rows of the array programmed to alternating states are disposed in adjacent rows.

11. The method of claim 9 wherein the transistor cells each include a floating gate electrode and a control gate electrode.

12. A method of programming a nonvolatile semiconductor memory which includes an array of programmable transistor cells arranged in Y number of columns and X number of rows and wherein the cells in at least two rows of the array have been programmed to alternating low and high threshold states both along the rows and along the columns, with the low threshold cells being designated as select cells, said method comprising the following steps:

inputting programming voltages to the select cells; and controlling the select cells so that the programming voltages are applied to selected ones of the remaining cells other than the cells disposed in the at least two rows.

13. The method of claim 12 wherein the transistor cells include a floating gate and a control gate electrode.

* * * * *